(12) United States Patent
Sano et al.

(10) Patent No.: US 9,215,825 B2
(45) Date of Patent: Dec. 15, 2015

(54) GAS INSULATED SWITCHGEAR

(75) Inventors: Koji Sano, Tokyo (JP); Masahiro Arioka, Tokyo (JP); Tomotaka Yano, Tokyo (JP); Kyoichi Ohtsuka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 176 days.

(21) Appl. No.: 13/819,297

(22) PCT Filed: Jan. 28, 2011

(86) PCT No.: PCT/JP2011/051702
§ 371 (c)(1),
(2), (4) Date: Feb. 26, 2013

(87) PCT Pub. No.: WO2012/081264
PCT Pub. Date: Jun. 21, 2012

(65) Prior Publication Data
US 2013/0155640 A1    Jun. 20, 2013

(30) Foreign Application Priority Data

Dec. 17, 2010  (JP) .................................. 2010-281543

(51) Int. Cl.
*H05K 7/02* (2006.01)
*H01H 9/08* (2006.01)
(Continued)

(52) U.S. Cl.
CPC . *H05K 7/02* (2013.01); *H01H 9/08* (2013.01); *H01H 33/666* (2013.01); *H02B 13/035* (2013.01); *H02B 13/0356* (2013.01); *H02H 9/02* (2013.01)

(58) Field of Classification Search
CPC .......... H02B 7/01; H02B 7/02; H02B 13/035; H02B 13/0356; H02H 7/22; H02H 7/222; H02H 9/02; H01H 33/666; H01H 33/14; H01H 33/38; H01H 9/16; H01H 9/08
USPC ......... 361/612, 618, 600–605, 611, 614, 622, 361/623, 624, 816, 818; 218/7, 13, 14, 32, 218/43, 120, 139, 140, 78, 84, 92, 154
See application file for complete search history.

(56) References Cited

U.S. PATENT DOCUMENTS 3,686,600 A * 8/1972 Conner et al. ................... 336/70
6,140,573 A * 10/2000 Smith et al. .................. 174/31 R
(Continued)

FOREIGN PATENT DOCUMENTS

JP    55-112332 U    8/1980
JP    09-019014 A    1/1997
(Continued)

OTHER PUBLICATIONS

International Search Report (PCT/ISA/210) issued on Mar. 1, 2011, by the Japanese Patent Office as the International Searching Authority for International Application No. PCT/JP2011/051702.
(Continued)

*Primary Examiner* — Michail V Datskovskiy
(74) *Attorney, Agent, or Firm* — Buchanan Ingersoll & Rooney PC

(57) ABSTRACT

A gas insulated switchgear includes a transformer mounting body; a bushing mounted on the transformer mounting body; and a main circuit conductor. The main circuit conductor includes a first main circuit conductor which is connected to a circuit breaker and is located in the bushing and a second main circuit conductor which is connected to the first main circuit conductor. An insulator extends below the lower end of the transformer mounting body and toward the vicinity of the connection between the first main circuit conductor and the second main circuit conductor, in a region where the first main circuit conductor is located in the transformer mounting body. A ground shield is arranged in the insulator, and extends below the lower end of the transformer mounting body and above a coupling portion between the transformer mounting body and the bushing.

8 Claims, 4 Drawing Sheets

(51) Int. Cl.
  *H01H 33/666* (2006.01)
  *H02H 9/02* (2006.01)
  *H02B 13/035* (2006.01)

(56) References Cited

U.S. PATENT DOCUMENTS

| | | | | |
|---|---|---|---|---|
| 6,630,638 | B1 * | 10/2003 | Freeman | H02B 5/06 200/50.21 |
| 7,511,243 | B2 * | 3/2009 | Laskowski | H02B 13/035 218/14 |
| 8,908,337 | B2 * | 12/2014 | Gorablenkow | H01F 27/402 361/35 |
| 2002/0134757 | A1 * | 9/2002 | Nishizumi et al. | 218/118 |
| 2004/0251237 | A1 * | 12/2004 | Meyer | H02B 5/06 218/43 |
| 2007/0151953 | A1 * | 7/2007 | Meinherz | H02B 5/06 218/155 |
| 2012/0228266 | A1 * | 9/2012 | Nakada | H01H 33/42 218/120 |

FOREIGN PATENT DOCUMENTS

| | | | |
|---|---|---|---|
| JP | 2001-266681 A | | 9/2001 |
| JP | 2003-319515 A | | 11/2003 |
| JP | 2011096496 A | * | 5/2011 |

OTHER PUBLICATIONS

Office Action (First Office Action) issued on Dec. 1, 2014, by the Chinese Patent Office in corresponding Chinese Patent Application No. 201180047451.5, and an English translation of the Office Action. (13 pages).

Chinese Second Office Action dated Jul. 23, 2015 issued in the corresponding Chinese Patent Application No. 201180047451.5 and English translation (10 pages).

* cited by examiner

GAS INSULATED SWITCHGEAR

TECHNICAL FIELD

The present invention relates to, for example, gas insulated switchgears for use in electric power transmission/distribution and reception facilities.

BACKGROUND ART

Heretofore, for example, as gas insulated switchgears for use in electric power transmission/distribution and reception facilities, there has been known one which is disclosed in Patent Document 1 (Japanese Unexamined Patent Publication No. 2003-319515).

A pressure tank containing a circuit breaker is provided in an interruption portion, a pressure tank is provided in an operation portion, and insulating gas is filled in both pressure tanks.

The circuit breaker is supported in the tank via supporting insulators. The circuit breaker is composed of an insulation cylinder which is sealed by providing sealing electrodes and is filled with insulating gas inside thereof, a fixed lead which passes airtightly through the sealing electrode and has a fixed electrode at an internal end portion, and a movable lead which passes airtightly through the sealing electrode via a bellows and has a movable electrode at an internal end portion.

An external end portion of the fixed lead is connected to a main circuit terminal via a conductor in a bushing. Meanwhile, the movable lead is connected to a main circuit terminal via a conductor in a bushing. A sliding conductor slidable with respect to the movable lead is provided between the conductor and the movable lead.

Then, each of conductors 13, 17 is coated with epoxy resin. An electric field is relaxed by the epoxy resin coated on each of the conductors 13, 17.

Patent Document 1: Japanese Unexamined Patent Publication No. 2003-319515

DISCLOSURE OF THE INVENTION

Problems to be Solved by the Invention

The aforementioned known gas insulated switchgear achieves insulation properties and electric field relaxation by filling high pressure insulating gas in each of the pressure tanks and each of the bushings. However, a problem exists in that the electric field relaxation cannot be sufficiently achieved by only coating the epoxy resin on each of the conductors 13, 17 in each of the bushings.

Furthermore, a problem exists in that, particularly, electric field relaxation of a current transformer mounting cylindrical body portion arranged on an upper opening portion of the pressure tank cannot be sufficiently achieved because a current transformer is mounted.

In addition, a problem exists in that, in order to sufficiently achieve the electric field relaxation of the current transformer mounting cylindrical body portion, the current transformer mounting cylindrical body portion needs to be large and the current transformer itself also needs to be large and therefore it becomes large in size.

The present invention has been made to solve the problem described above, and an object of the present invention is to provide a gas insulated switchgear capable of achieving reduction in size.

Means for Solving the Problems

According to the present invention, there is provided a gas insulated switchgear including: a ground tank which houses a circuit breaker and is filled with insulating gas; a current transformer mounting cylindrical body whose one side is mounted on an opening portion formed on the upper side of the ground tank; a porcelain bushing whose one side is mounted on the other side of the current transformer mounting cylindrical body; and a main circuit conductor which is passed through the porcelain bushing and the current transformer mounting cylindrical body, one side of the main circuit conductor being connected to the circuit breaker and the other side thereof being connected to a main circuit terminal provided on the other side of the porcelain bushing. The gas insulated switchgear includes: an insulator which is provided extending further downward than the lower end of the current transformer mounting cylindrical body and increasing its extended insulator outer diameter than an insulator outer diameter located in the current transformer mounting cylindrical body, and extending further upward than a coupling portion between the current transformer mounting cylindrical body and the porcelain bushing and increasing its extended insulator outer diameter than the insulator outer insulator diameter located in the current transformer mounting cylindrical body, in a region where the main circuit conductor is located in the current transformer mounting cylindrical body; and a ground shield which is arranged in the insulator, and which is provided extending further downward than the lower end of the current transformer mounting cylindrical body and extending further upward than the coupling portion between the current transformer mounting cylindrical body and the porcelain bushing.

Furthermore, according to the present invention, there is provided a gas insulated switchgear including: a ground tank which houses a circuit breaker and is filled with insulating gas; a current transformer mounting cylindrical body whose one side is mounted on an opening portion formed on the upper side of the ground tank; a porcelain bushing whose one side is mounted on the other side of the current transformer mounting cylindrical body; and a main circuit conductor which is passed through the porcelain bushing and the current transformer mounting cylindrical body, one side of the main circuit conductor being connected to the circuit breaker and the other side thereof being connected to a main circuit terminal provided on the other side of the porcelain bushing. The main circuit conductor is composed of: a first main circuit conductor whose one side is connected to the circuit breaker and whose other side is located in one side of the porcelain bushing; and a second main circuit conductor which is connected to the first main circuit conductor and the main circuit terminal. The gas insulated switchgear includes: an insulator which is provided extending further downward than the lower end of the current transformer mounting cylindrical body and toward the vicinity of the circuit breaker and increasing its extended insulator outer diameter than an insulator outer diameter located in the current transformer mounting cylindrical body, and extending toward the vicinity of a connection portion between the first main circuit conductor and the second main circuit conductor and increasing its extended insulator outer diameter than the insulator outer diameter located in the current transformer mounting cylindrical body, in a region where the first main circuit conductor is located in the current transformer mounting cylindrical body; and a ground shield which is arranged in the insulator, and which is provided extending further downward than the lower end of the current transformer mounting cylindrical body and extending further upward than a coupling portion between the current transformer mounting cylindrical body and the porcelain bushing.

Advantageous Effect of the Invention

According to a gas insulated switchgear of the present invention, there can be obtained a gas insulated switchgear capable of achieving reduction in size of the device.

MODE FOR CARRYING OUT THE INVENTION

Embodiment 1

Figure 1:
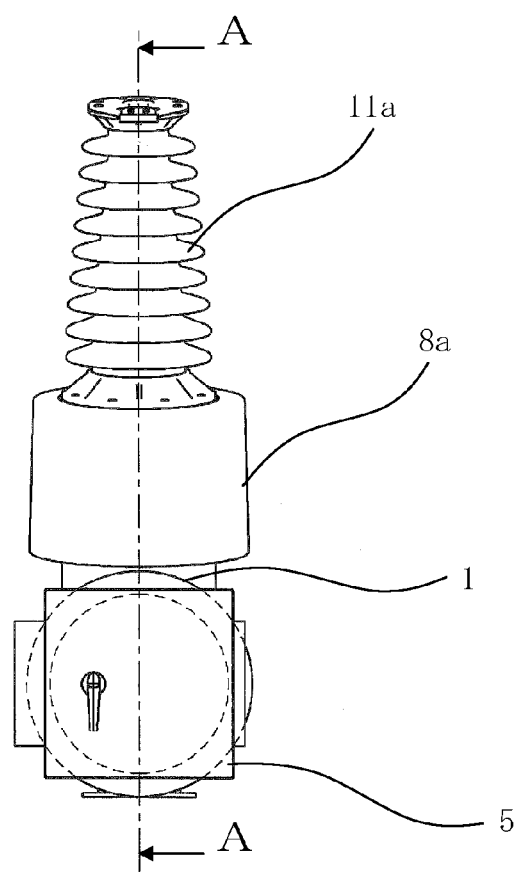
FIG. 1 is a side view showing a gas insulated switchgear according to Embodiment 1 of the present invention.
Figure 2:
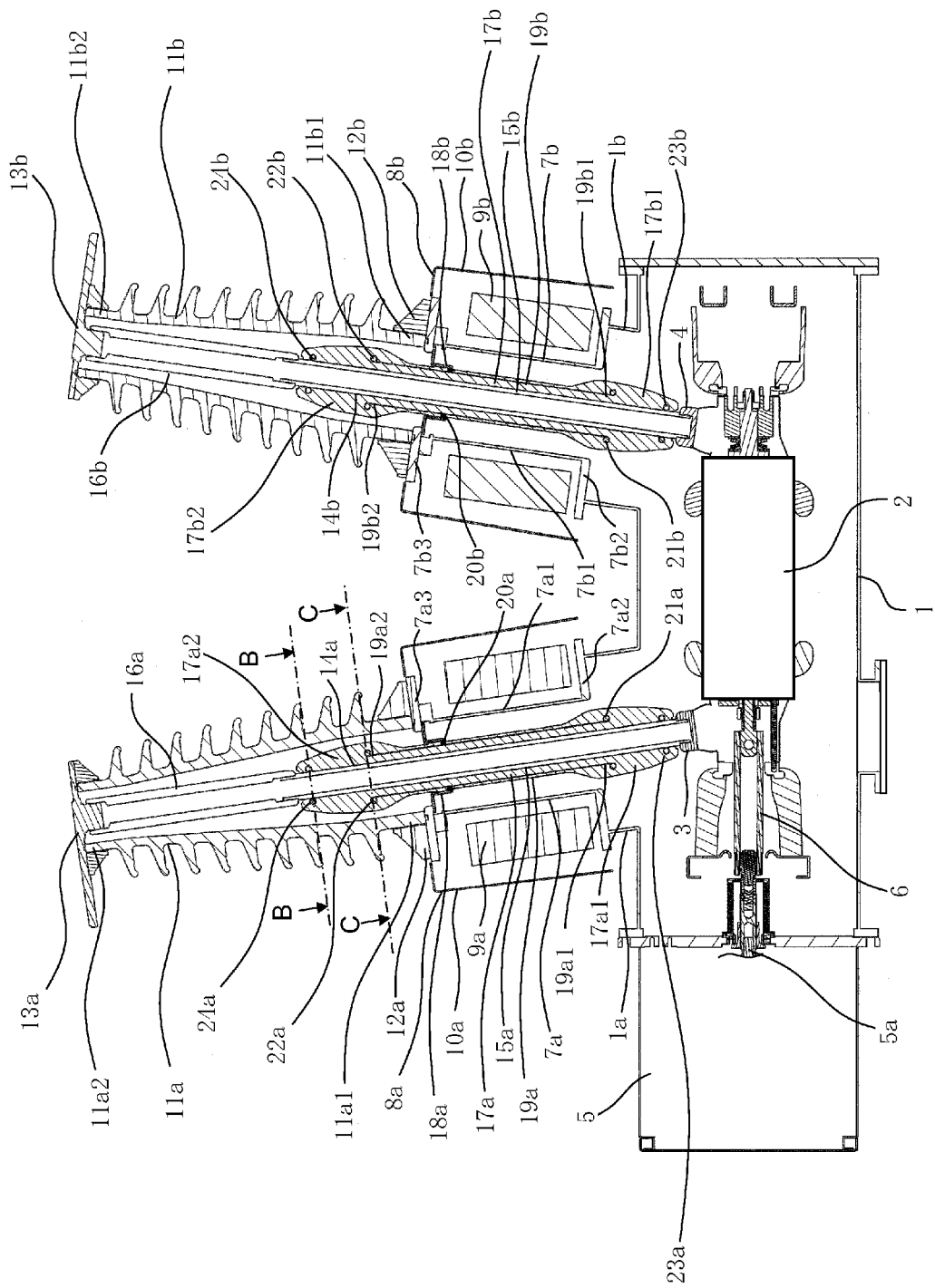
FIG. 2 is a sectional view taken along the line A-A of FIG. 1 showing the gas insulated switchgear according to Embodiment 1 of the present invention.
Figure 3:
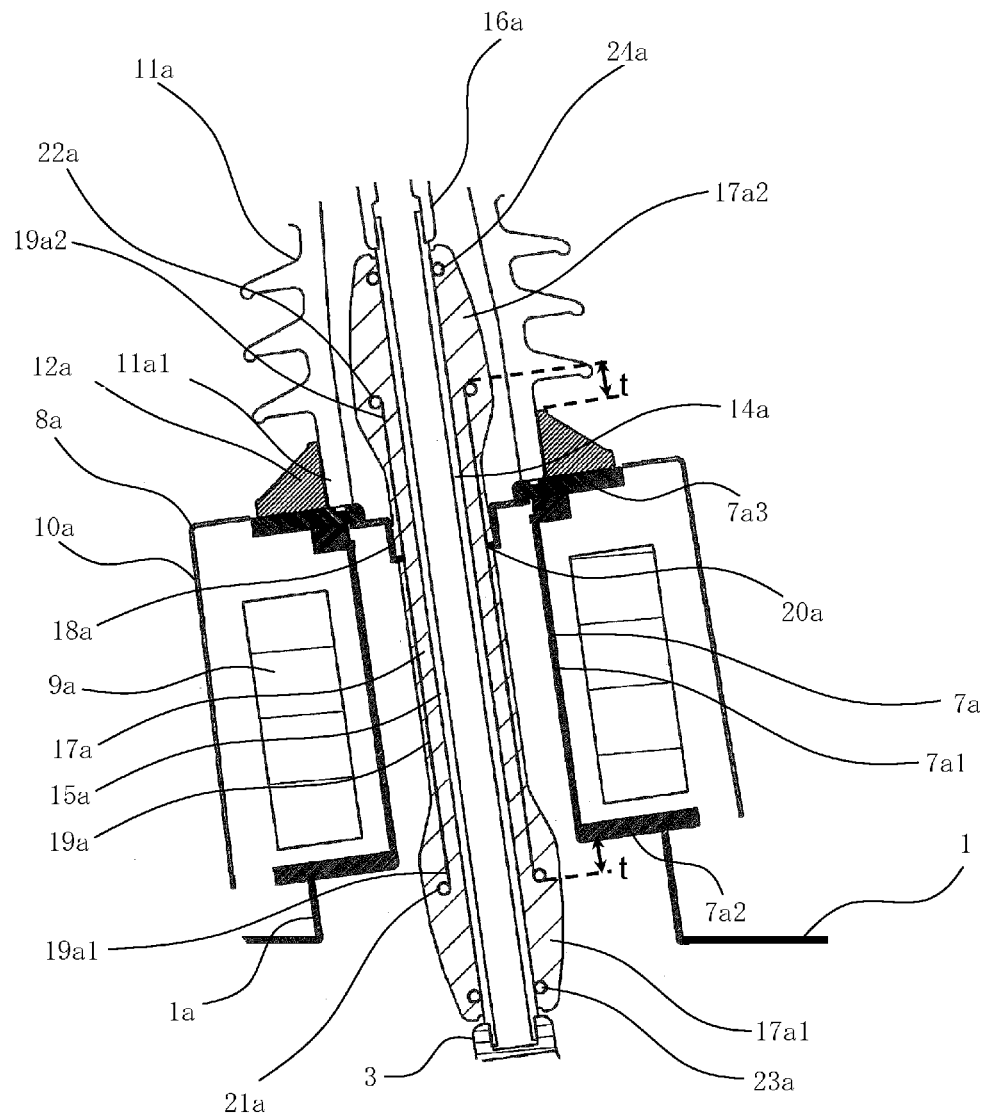
FIG. 3 is a relevant part enlarged sectional view showing the gas insulated switchgear according to Embodiment 1 of the present invention.
Figure 4:
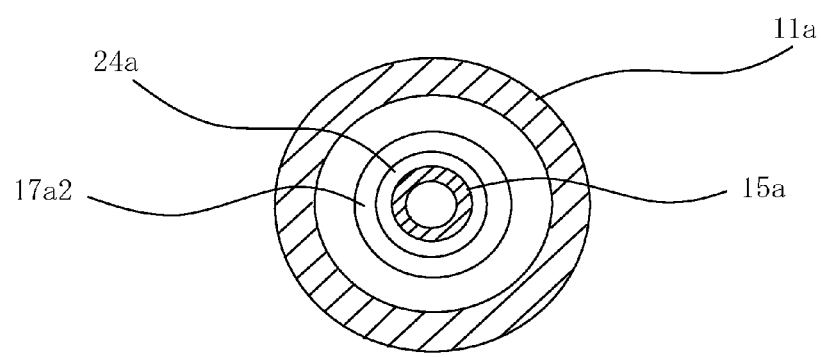
FIG. 4 is a relevant part enlarged sectional view taken along the line B-B of FIG. 2 showing the gas insulated switchgear according to Embodiment 1 of the present invention.
Figure 5:
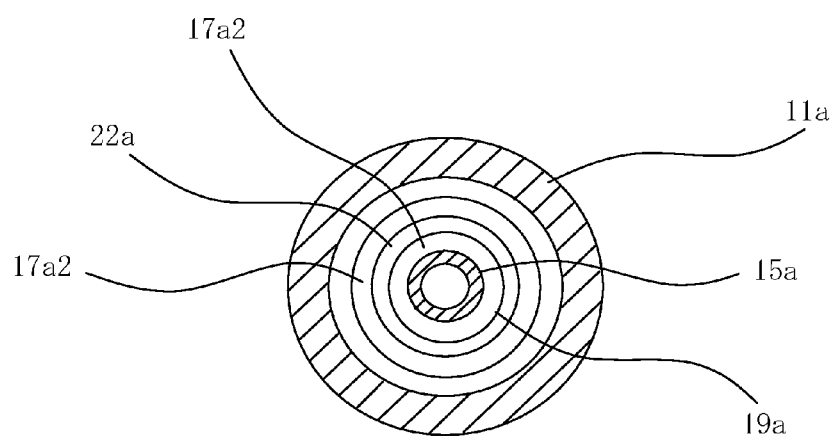
FIG. 5 is a relevant part enlarged sectional view taken along the line C-C of FIG. 2 showing the gas insulated switchgear according to Embodiment 1 of the present invention.

Hereinafter, Embodiment 1 of the present invention will be described with reference to FIG. 1 to FIG. 5. Then, in each of the drawings, identical or equivalent members and portions will be described with the same reference numerals assigned thereto. FIG. 1 is a side view showing a gas insulated switchgear according to Embodiment 1 of the present invention. FIG. 2 is a sectional view taken along the line A-A of FIG. 1 showing the gas insulated switchgear according to Embodiment 1 of the present invention. FIG. 3 is a relevant part enlarged sectional view showing the gas insulated switchgear according to Embodiment 1 of the present invention. FIG. 4 is a relevant part enlarged sectional view taken along the line B-B of FIG. 2 showing the gas insulated switchgear according to Embodiment 1 of the present invention. FIG. 5 is a relevant part enlarged sectional view taken along the line C-C of FIG. 2 showing the gas insulated switchgear according to Embodiment 1 of the present invention.

A grounded tank 1 is electrically grounded and insulating gas is filled inside thereof; and, for example, insulating gas such as dry air, nitrogen, or carbonic anhydride, which is substantially zero in global warming potential and effective for global warming prevention, is filled as the insulating gas. A circuit breaker 2 is configured by, for example, a vacuum circuit breaker housed in the grounded tank 1. The circuit breaker 2 has a movable side conductor portion 3 and a fixed side conductor portion 4. An operating unit 5 performs switching operation of the circuit breaker 2; and an operating rod 5a is coupled to an insulating rod 6 of the circuit breaker 2. A movable side opening portion 1a and a fixed side opening portion 1b are provided on the upper side of the grounded tank 1.

A movable side current transformer mounting cylindrical body 7a is coaxially mounted on the movable side opening portion 1a formed on the upper side of the grounded tank 1; and a movable side current transformer unit 8a which is for measuring current is mounted thereon.

A fixed side current transformer mounting cylindrical body 7b is coaxially mounted on the fixed side opening portion 1b formed on the upper side of the grounded tank 1; and a fixed side current transformer unit 8b which is for measuring current is mounted thereon.

The movable side current transformer mounting cylindrical body 7a is composed of a movable side cylindrical body portion 7a1, a movable side lower flange 7a2, and a movable side upper flange 7a3.

The fixed side current transformer mounting cylindrical body 7b is composed of a fixed side cylindrical body portion 7b1, a fixed side lower flange 7b2, and a fixed side upper flange 7b3.

The movable side current transformer unit 8a is composed of a movable side current transformer 9a which is placed on an outer circumferential portion of the movable side current transformer mounting cylindrical body 7a and is for measuring current, and a movable side protective cover 10a which protects the movable side current transformer 9a.

The fixed side current transformer unit 8b is composed of a fixed side current transformer 8b which is placed on an outer circumferential portion of the fixed side current transformer mounting cylindrical body 7b and is for measuring current, and a fixed side protective cover 10b which protects the fixed side current transformer 9b.

One side 11a1 of a movable side bushing 11a is mounted on the upper flange 7a3 of the movable side current transformer mounting cylindrical body 7a by a ground flange of a movable side porcelain bushing 12a, and the other side 11a2 is attached to a movable side main circuit terminal 13a. There is shown a case where the ground flange of the movable side porcelain bushing 12a is made of an aluminum material.

One side 11b1 of a fixed side bushing 11b is mounted on the upper flange 7b3 of the fixed side current transformer mounting cylindrical body 7b by a ground flange of a fixed side porcelain bushing 12b, and the other side 11b2 is attached to a fixed side main circuit terminal 13b. There is shown a case where the ground flange of the fixed side porcelain bushing 12b is made of an aluminum material.

A movable side main circuit conductor 14a is passed through the movable side bushing 11a and the movable side current transformer mounting cylindrical body 7a; and one side of the movable side main circuit conductor 14a is connected to the movable side conductor portion 3 of the circuit breaker 2 and the other side thereof is connected to the movable side main circuit terminal 13a provided on the other side 11a2 of the movable side bushing 11a.

As an example, the drawing shows a case where the movable side main circuit conductor 14a is composed of a movable side first main circuit conductor 15a whose one side is connected to the movable side conductor portion 3 of the circuit breaker 2 and whose other side is located in one side 11a1 of the movable side bushing 11a, and a movable side second main circuit conductor 16a which is connected to the movable side first main circuit conductor 15a and the movable side main circuit terminal 13a.

A fixed side main circuit conductor 14b is passed through the fixed side bushing 11b and the fixed side current transformer mounting cylindrical body 7b; and one side of the fixed side main circuit conductor 14b is connected to the fixed side conductor portion 4 of the circuit breaker 2 and the other side thereof is connected to the fixed side main circuit terminal 13b provided on the other side 11b2 of the fixed side bushing 11b.

As an example, the drawing shows a case where the fixed side main circuit conductor 14b is composed of a fixed side first main circuit conductor 15b whose one side is connected to the fixed side conductor portion 4 of the circuit breaker 2 and whose other side is located in one side 11b1 of the fixed side bushing 11b, and a fixed side second main circuit conductor 16b which is connected to the fixed side first main circuit conductor 15b and the fixed side main circuit terminal 13b.

A movable side insulator 17a is provided extending further downward than the movable side lower flange 7a2 that is the lower end of the movable side current transformer mounting cylindrical body 7a and extending further upward than a coupling portion between the movable side current transformer mounting cylindrical body 7a and the movable side bushing 11a, in a region where the movable side main circuit conductor 14a is located in the movable side current transformer mounting cylindrical body 7a.

As an example, the drawing shows a case where the lower side 17a1 of the movable side insulator 17a is provided extending further downward than the movable side lower flange 7a2 that is the lower end of the movable side current transformer mounting cylindrical body 7a and toward the vicinity of the movable side conductor portion 3 of the circuit breaker 2, and the upper side 17a2 of the movable side insulator 17a is provided extending further upward than the coupling portion between the movable side current transformer mounting cylindrical body 7a and the movable side bushing 11a and toward the vicinity of a connection portion between the movable side first main circuit conductor 15a and the second main circuit conductor 16a, in a region where the movable side first main circuit conductor 15a is located in the movable side current transformer mounting cylindrical body 7a.

Incidentally, the outer diameter dimension of the lower side 17a1 of the movable side insulator 17a is configured to be larger than the outer diameter dimension of a central portion of the movable side insulator 17a and is configured to be smaller in diameter toward the vicinity of the movable side conductor portion 3 of the circuit breaker 2. Furthermore, the outer diameter dimension of the upper side 17a2 of the movable side insulator 17a is configured to be larger than the outer diameter dimension of the central portion of the movable side insulator 17a and is configured to be smaller in diameter toward the vicinity of the connection portion between the movable side first main circuit conductor 15a and the movable side second main circuit conductor 16a.

A fixed side insulator 17b is provided extending further downward than the fixed side lower flange 7b2 that is the lower end of the fixed side current transformer mounting cylindrical body 7b and extending further upward than a coupling portion between the fixed side current transformer mounting cylindrical body 7b and the fixed side bushing 11b, in a region where the fixed side main circuit conductor 14b is located in the fixed side current transformer mounting cylindrical body 7b.

As an example, the drawing shows a case where the lower side 17b1 of the fixed side insulator 17b is provided extending further downward than the fixed side lower flange 7b2 that is the lower end of the fixed side current transformer mounting cylindrical body 7b and toward the vicinity of the fixed side conductor portion 4 of the circuit breaker 2, and the upper side 17b2 of the fixed side insulator 17b is provided extending further upward than a coupling portion between the fixed side current transformer mounting cylindrical body 7b and the fixed side bushing 11b and toward the vicinity of a connection portion between the fixed side first main circuit conductor 15b and the fixed side second main circuit conductor 16b, in a region where the fixed side first main circuit conductor 15b is located in the fixed side current transformer mounting cylindrical body 7b.

Incidentally, the outer diameter dimension of the lower side 17b1 of the fixed side insulator 17b is configured to be larger than the outer diameter dimension of a central portion of the fixed side insulator 17b and is configured to be smaller in diameter toward the vicinity of the fixed side conductor portion 4 of the circuit breaker 2. Furthermore, the outer diameter dimension of the upper side 17b2 of the fixed side insulator 17b is configured to be larger than the outer diameter dimension of the central portion of the fixed side insulator 17b and is configured to be smaller in diameter toward the vicinity of the connection portion between the fixed side first main circuit conductor 15b and the fixed side second main circuit conductor 16b.

A movable side insulation support clamp 18a is attached to the movable side upper flange 7a3 of the movable side current transformer mounting cylindrical body 7a to support the movable side insulator 17a.

A fixed side insulation support clamp 18b is attached to the fixed side upper flange 7b3 of the fixed side current transformer mounting cylindrical body 7b to support the fixed side insulator 17b.

A movable side ground shield 19a is longitudinally arranged in the movable side insulator 17a. A lower side end portion 19a1 of the movable side ground shield 19a is provided extending further downward than the movable side lower flange 7a2 that is the lower end of the movable side current transformer mounting cylindrical body 7a; and an upper side end portion 19a2 of the movable side ground shield 19a is provided extending further upward than the coupling portion between the movable side current transformer mounting cylindrical body 7a and the movable side bushing 11a, for example, extending further upward than the ground flange of the movable side porcelain bushing 12a.

As an example, the drawing shows a case where the lower side end portion 19a1 of the movable side ground shield 19a extends further downward by t than the movable side lower flange 7a2 that is the lower end of the movable side current transformer mounting cylindrical body 7a; and the upper side end portion 19a2 of the movable side ground shield 19a extends further upward by t than the coupling portion between the movable side current transformer mounting cylindrical body 7a and the movable side bushing 11a, for example, extends further upward by t than the ground flange of the movable side porcelain bushing 12a. The dimension of t is set to, for example, 35 mm; however, the dimension is not limited to this.

A fixed side ground shield 18b is longitudinally arranged in the fixed side insulator 17b. A lower side end portion 19b1 of the fixed side ground shield 18b is provided extending further downward than the fixed side lower flange 7b2 that is the lower end of the fixed side current transformer mounting cylindrical body 7b; and an upper side end portion 19b2 of the fixed side ground shield 18b is provided extending further upward than the coupling portion between the fixed side current transformer mounting cylindrical body 7b and the fixed side bushing 11b, for example, extending further upward than the ground flange of the fixed side porcelain bushing 12b.

As an example, the drawing shows a case where, as in the movable side ground shield 19a, the lower side end portion 19b1 of the fixed side ground shield 18b extends further downward by t than the fixed side lower flange 7b2 that is the lower end of the fixed side current transformer mounting cylindrical body 7b; and the upper side end portion 19b2 of the fixed side ground shield 18b extends further upward by t than the coupling portion between the fixed side current transformer mounting cylindrical body 7b and the fixed side bushing 11b, for example, extends further upward by t than the ground flange of the fixed side porcelain bushing 12b. The dimension of t is set to, for example, 35 mm; however, the dimension is not limited to this.

A movable side ground shield support 20a grounds the movable side insulation support clamp 18a and the movable side ground shield 19a; and a fixed side ground shield support 20b grounds the fixed side insulation support clamp 18b and the fixed side ground shield 19b.

Then, the lower side end portion 19a1 of the movable side ground shield 19a is provided with a movable side electric field relaxation ring 21a, and the upper side end portion 19a2 thereof is provided with a movable side electric field relaxation ring 22a. The lower side end portion 19b1 of the fixed side ground shield 18b is provided with a fixed side electric field relaxation ring 21b, and the upper side end portion 19b2 thereof is provided with a fixed side electric field relaxation ring 22b.

Furthermore, a movable side electric field relaxation ring 23a is provided at the lower side 17a1 of the movable side insulator 17a in the vicinity of the movable side conductor portion 3 of the circuit breaker 2, and a movable side electric field relaxation ring 24a is provided at the upper side 17a2 of the movable side insulator 17a in the vicinity of the connection portion of the movable side first main circuit conductor 15a and the movable side second main circuit conductor 16a.

A fixed side electric field relaxation ring 23b is provided at the lower side 17b1 of the fixed side insulator 17b in the vicinity of the fixed side conductor portion 4 of the circuit breaker 2, and a fixed side electric field relaxation ring 24b is provided at the upper side 17b2 of the fixed side insulator 17b in the vicinity of the connection portion between the fixed side first main circuit conductor 15b and the fixed side second main circuit conductor 16b.

Incidentally, insulating gas in the grounded tank 1 is filled between the movable side insulator 17a and the movable side cylindrical body portion 7a1 of the movable side current transformer mounting cylindrical body 7a, between the fixed side insulator 17b and the fixed side cylindrical body portion 7b1 of the fixed side current transformer mounting cylindrical body 7b, between the upper side 17a2 of the movable side insulator 17a and the movable side bushing 11a, between the movable side second main circuit conductor 16a and the movable side bushing 11a, between the upper side 17b2 of the fixed side insulator 17b and the ground flange of the fixed side porcelain bushing 12b, and between the fixed side second main circuit conductor 16b and the fixed side bushing 11b, respectively.

Next, operation of the thus configured gas insulated switchgear will be described. The movable side insulator 17a is provided such that the lower side 17a1 extends further downward than the lower flange 7a2 that is the lower end of the movable side current transformer mounting cylindrical body 7a and the upper side 17a2 extends further upward than the coupling portion between the movable side current transformer mounting cylindrical body 7a and the movable side bushing 11a, in the region where the movable side first main circuit conductor 15a is located in the movable side current transformer mounting cylindrical body 7a. Then, the movable side ground shield 19a is longitudinally arranged in the movable side insulator 17a, the lower side end portion 19a1 of the movable side ground shield 19a is made to extend further downward than the movable side lower flange 7a2 that is the lower end of the movable side current transformer mounting cylindrical body 7a, and the upper side end portion 19a2 of the movable side ground shield 19a is made to extend further upward than the coupling portion between the movable side current transformer mounting cylindrical body 7a and the movable side bushing 11a, for example, extends further upward than the ground flange of the movable side porcelain bushing 12a. Therefore, insulation performance of the movable side first main circuit conductor 15a can be remarkably enhanced and an electric field of an intermediate portion of the movable side first main circuit conductor 15a can be suppressed.

Furthermore, the fixed side insulator 17b is provided such that the lower side 17b1 extends further downward than the lower flange 7b2 that is the lower end of the fixed side current transformer mounting cylindrical body 7b and the upper side 17b2 extends further upward than the coupling portion between the fixed side current transformer mounting cylindrical body 7b and the fixed side bushing 11b, in the region where the fixed side first main circuit conductor 15b is located in the fixed side current transformer mounting cylindrical body 7b. Then, the fixed side ground shield 18b is longitudinally arranged in the fixed side insulator 17b, the lower side end portion 19b1 of the fixed side ground shield 18b is made to extend further downward than the fixed side lower flange 7b2 that is the lower end of the fixed side current transformer mounting cylindrical body 7b, and the upper side end portion 19b2 of the fixed side ground shield 18b is made to extend further upward than the coupling portion between the fixed side current transformer mounting cylindrical body 7b and the fixed side bushing 11b, for example, extends further upward than the ground flange of the fixed side porcelain bushing 12b. Therefore, insulation performance of the fixed side first main circuit conductor 15b can be remarkably enhanced and an electric field of the intermediate portion of the fixed side first main circuit conductor 15b can be suppressed.

As described above, the insulation performance of the movable side first main circuit conductor 15a and the fixed side first main circuit conductor 15b can be remarkably enhanced and the electric field of the intermediate portions of the movable side first main circuit conductor 15a and the fixed side first main circuit conductor 15b can be suppressed; and therefore, reduction in size of the movable side current transformer mounting cylindrical body 7a and the fixed side current transformer mounting cylindrical body 7b can be achieved. Furthermore, the insulation performance can be remarkably enhanced; and therefore, the pressure of insulating gas filled under high pressure in the grounded tank 1 can be lowered and reduction in weight of the grounded tank 1 can be achieved. As described above, reduction in size and weight can be achieved by remarkably enhancing the insulation performance; and therefore, reduction in cost can also be achieved.

Furthermore, the lower side end portion 19a1 of the movable side ground shield 19a is provided with the movable side electric field relaxation ring 21a, and the upper side end portion 19a2 thereof is provided with the movable side electric field relaxation ring 22a; and the lower side end portion 19b1 of the fixed side ground shield 18b is provided with the fixed side electric field relaxation ring 21b, and the upper side end portion 19b2 thereof is provided with the fixed side electric field relaxation ring 22b. Accordingly, an electric field to be concentrated on an edge portion of the movable side lower flange 7a2, an electric field to be concentrated on an edge portion of the fixed side lower flange 7b2, an electric field to be concentrated on an edge portion of the ground flange of the movable side porcelain bushing 12a, and an electric field to be concentrated on an edge portion of the ground flange of the fixed side porcelain bushing 12b can be relaxed, respectively.

The outer diameter dimension of the lower side 17a1 of the movable side insulator 17a is configured to be larger than the outer diameter dimension of the central portion of the movable side insulator 17a and is configured to be smaller in diameter toward the vicinity of the movable side conductor portion 3 of the circuit breaker 2; and accordingly, insulation performance in the vicinity of the movable side conductor portion 3 of the circuit breaker 2 can be enhanced. Furthermore, the outer diameter dimension of the upper side 17a2 of the movable side insulator 17a is configured to be larger than the outer diameter dimension of the central portion of the movable side insulator 17a and is configured to be smaller in diameter toward the vicinity of the connection portion between the movable side first main circuit conductor 15a and the movable side second main circuit conductor 16a; and accordingly, insulation performance in the vicinity of the connection portion between the movable side first main circuit conductor 15a and the movable side second main circuit conductor 16a can be enhanced.

The outer diameter dimension of the lower side 17b1 of the fixed side insulator 17b is configured to be larger than the outer diameter dimension of the central portion of the fixed side insulator 17b and is configured to be smaller in diameter toward the vicinity of the fixed side conductor portion 4 of the circuit breaker 2; and accordingly, insulation performance in the vicinity of the fixed side conductor portion 4 of the circuit breaker 2 can be enhanced. Furthermore, the outer diameter dimension of the upper side 17b2 of the fixed side insulator 17b is configured to be larger than the outer diameter dimension of the central portion of the fixed side insulator 17b and is configured to be smaller in diameter toward the vicinity of the connection portion between the fixed side first main circuit conductor 15b and the fixed side second main circuit conductor 16b; and accordingly, insulation performance in the vicinity of the connection portion between the fixed side first main circuit conductor 15b and the fixed side second main circuit conductor 16b can be enhanced.

Furthermore, the movable side electric field relaxation ring 23a is provided at the lower side 17a1 of the movable side insulator 17a in the vicinity of the movable side conductor portion 3 of the circuit breaker 2, and the movable side electric field relaxation ring 24a is provided at the upper side 17a2 of the movable side insulator 17a in the vicinity of the connection portion of the movable side first main circuit conductor 15a and the movable side second main circuit conductor 16a. Accordingly, an electric field to be concentrated on the connection portion between the movable side first main circuit conductor 15a and the movable side conductor portion 3 of the circuit breaker 2, and an electric field to be concentrated on the connection portion between the movable side first main circuit conductor 15a and the movable side second main circuit conductor 16a can be suppressed, respectively.

The fixed side electric field relaxation ring 23b is provided at the lower side 17b1 of the fixed side insulator 17b in the vicinity of the fixed side conductor portion 4 of the circuit breaker 2, and the fixed side electric field relaxation ring 24b is provided at the upper side 17b2 of the fixed side insulator 17b in the vicinity of the connection portion between the fixed side first main circuit conductor 15b and the fixed side second main circuit conductor 16b. Accordingly, an electric field to be concentrated on the connection portion between the fixed side first main circuit conductor 15b and the fixed side conductor portion 4 of the circuit breaker 2, and an electric field to be concentrated on the connection portion between the fixed side first main circuit conductor 15b and the fixed side second main circuit conductor 16b can be suppressed, respectively.

By the way, in the aforementioned Embodiment 1, the description has been made on the case where the movable side main circuit conductor 14a is composed of the movable side first main circuit conductor 15a whose one side is connected to the movable side conductor portion 3 of the circuit breaker 2 and whose other side is located in one side 11a1 of the movable side bushing 11a, and the movable side second main circuit conductor 16a to be connected to the movable side first main circuit conductor 15a and the movable side main circuit terminal 13a; and the fixed side main circuit conductor 14b is composed of the fixed side first main circuit conductor 15b whose one side is connected to the fixed side conductor portion 4 of the circuit breaker 2 and whose other side is located in one side 11b1 of the fixed side bushing 11b, and the fixed side second main circuit conductor 16b to be connected to the fixed side first main circuit conductor 15b and the fixed side main circuit terminal 13b. However, as described above, the configuration is made such that the movable side main circuit conductor 14a and the fixed side main circuit conductor 14b are divided; and accordingly, the movable side first main circuit conductor 15a, the movable side current transformer mounting cylindrical body 7a, and the movable side current transformer 9a and the fixed side first main circuit conductor 15b, the fixed side current transformer mounting cylindrical body 7b, and the fixed side current transformer 8b can be commonly available to various models on the grounded tank 1 as generic products, respectively.

Then, the movable side second main circuit conductor 16a and the fixed side second main circuit conductor 16b may be selected corresponding to the length (height) of the movable side main circuit conductor 14a and the fixed side main circuit conductor 14b depending on various models. Therefore, there can be obtained the gas insulated switchgear which is capable of dealing with various variations and is excellent in economic efficiency.

INDUSTRIAL APPLICABILITY

The present invention is suitable for achieving a gas insulated switchgear capable of achieving reduction in size.

The invention claimed is:
1. A gas insulated switchgear comprising:
a ground tank which houses a circuit breaker and is filled with insulating gas;
a current transformer mounting cylindrical body whose one side is mounted on an opening portion formed on the upper side of said ground tank;
a porcelain bushing whose one side is mounted on the other side of said current transformer mounting cylindrical body; and
a main circuit conductor which is passed through said porcelain bushing and said current transformer mounting cylindrical body, one side of said main circuit conductor being connected to said circuit breaker and the other side thereof being connected to a main circuit terminal provided on the other side of said porcelain bushing,
said gas insulated switchgear including:
an insulator which is provided extending further downward than the lower end of said current transformer mounting cylindrical body and increasing its extended insulator outer diameter more than an insulator outer diameter located in said current transformer mounting cylindrical body, and extending further upward than a coupling portion between said current transformer mounting cylindrical body and said porcelain bushing and increasing its extended insulator outer diameter more than the insulator outer insulator diameter located in said current transformer mounting cylindrical body, in a region where said main circuit conductor is located in said current transformer mounting cylindrical body; and a ground shield which is arranged in said insulator, and which is provided extending further downward than the lower end of said current transformer mounting cylindrical body and extending further upward than the coupling portion between said current transformer mounting cylindrical body and said porcelain bushing.

2. A gas insulated switchgear comprising:

a ground tank which houses a circuit breaker and is filled with insulating gas;

a current transformer mounting cylindrical body whose one side is mounted on an opening portion formed on the upper side of said ground tank;

a porcelain bushing whose one side is mounted on the other side of said current transformer mounting cylindrical body; and a main circuit conductor which is passed through said porcelain bushing and said current transformer mounting cylindrical body, one side of said main circuit conductor being connected to said circuit breaker and the other side thereof being connected to a main circuit terminal provided on the other side of said porcelain bushing, said main circuit conductor being composed of:

a first main circuit conductor whose one side is connected to said circuit breaker and whose other side is located in one side of said porcelain bushing; and a second main circuit conductor which is connected to said first main circuit conductor and said main circuit terminal, and said gas insulated switchgear including:

an insulator which is provided extending further downward than the lower end of said current transformer mounting cylindrical body and toward the vicinity of said circuit breaker and increasing its extended insulator outer diameter more than an insulator outer diameter located in said current transformer mounting cylindrical body, and extending toward the vicinity of a connection portion between said first main circuit conductor and said second main circuit conductor and increasing its extended insulator outer diameter more than the insulator outer diameter located in said current transformer mounting cylindrical body, in a region where said first main circuit conductor is located in said current transformer mounting cylindrical body; and a ground shield which is arranged in said insulator, and which is provided extending further downward than the lower end of said current transformer mounting cylindrical body and extending further upward than a coupling portion between said current transformer mounting cylindrical body and said porcelain bushing.

3. The gas insulated switchgear according to claim 1, wherein a lower side end portion of said ground shield is provided with an electric field relaxation ring.

4. The gas insulated switchgear according to claim 1, wherein an upper side end portion of said ground shield is provided with an electric field relaxation ring.

5. The gas insulated switchgear according to claim 2, wherein said insulator is provided with an electric field relaxation ring in the vicinity of said circuit breaker.

6. The gas insulated switchgear according to claim 2, wherein said insulator is provided with an electric field relaxation ring in the vicinity of a connection portion between said first main circuit conductor and said second main circuit conductor.

7. The gas insulated switchgear according to claim 2, wherein a lower side end portion of said ground shield is provided with an electric field relaxation ring.

8. The gas insulated switchgear according to claim 2, wherein an upper side end portion of said ground shield is provided with an electric field relaxation ring.

\* \* \* \* \*